United States Patent [19]

Conti et al.

[11] 4,205,332
[45] May 27, 1980

[54] QUICK-QUENCHING POWER TRANSISTOR

[75] Inventors: Mario Conti; Gian P. Chiavarotti, both of Milan; Sandro Luciani, Saronno, all of Italy

[73] Assignee: SGS-Ates Componenti Elettronici S.p.A., Milan, Italy

[21] Appl. No.: 922,505

[22] Filed: Jul. 6, 1978

[30] Foreign Application Priority Data

Jul. 8, 1977 [IT] Italy .............................. 25518 A/77

[51] Int. Cl.$^2$ ............................................ H01L 29/72
[52] U.S. Cl. ........................................ 357/34; 357/52; 357/86
[58] Field of Search .......................... 357/34, 86, 52

[56] References Cited

U.S. PATENT DOCUMENTS 4,066,917  1/1978  Compton et al. ..................... 357/22

Primary Examiner—Edward J. Wojciechowicz
Attorney, Agent, or Firm—Karl F. Ross

[57] ABSTRACT

A junction transistor with a collector layer, a base layer and an emitter layer formed in a monocrystalline semiconductor body is provided with an ancillary layer of the same conductivity type as the emitter layer to accelerate the sweep-out of minority carriers at the instant of cutoff, the ancillary and base layers being bridged by a common metallic contact layer. The ancillary layer, which may be divided into several zones, is wholly surrounded by the base layer so as to be bounded by one or more closed lines along a body surface carrying the contact layer, the latter partly or completely overlying these lines. The ancillary and emitter layers may be formed in a single diffusion step through a common mask.

5 Claims, 5 Drawing Figures

QUICK-QUENCHING POWER TRANSISTOR

FIELD OF THE INVENTION

Our present invention relates to a power transistor of the junction type formed in a monocrystalline semiconductor substrate, preferably silicon, and having a collector layer of one conductivity type (e.g. N), an adjoining base layer of the opposite conductivity type (e.g. P), and an emitter layer of the same conductivity type as the collector layer, these semi-conductor layers being overlain by respective metallic contact layers serving as the transistor electrodes.

BACKGROUND OF THE INVENTION

The operation of such a transistor is based upon the movement of minority carriers (electrons in the case of an NPN transistor) which are injected from the emitter into the base upon the application of a saturation voltage to the latter. At the instant of cutoff, therefore, the potential difference between the collector and the emitter may exceed the supply voltage which may give rise to problems. Thus, upon termination of the state of saturation in the presence of a cutoff voltage it becomes important to reduce as far as possible the concentration of minority carriers in the base region to minimize the power dissipation resulting from that potential difference.

The delay between the application of the cutoff voltage and the return of the transistor to its normal nonconductive state may be divided into two phases referred to as "storage time" and "fall time". The storage time involves the sweep-out of mobile charge carriers from the collector region whereas the fall time measures the normalization of the concentration of minority carriers in the base region. These two phases are somewhat interrelated.

OBJECT OF THE INVENTION

The object of our present invention, accordingly, is to provide means in such a power transistor for accelerating the sweep-out of minority carriers and minimizing the storage and fall times occurring upon cutoff without significantly altering other transistor parameters such as its maximum-voltage rating, its current gain and its collector/emitter voltage on saturation.

SUMMARY OF THE INVENTION

In accordance with our present invention, an insular ancillary layer of the same conductivity type as the collector and the emitter is formed in the base layer along a surface of the semiconductor body, this insular layer being wholly surrounded by the base layer and therefore separated from the emitter layer; the base and ancillary layers are bridged along their surface boundary by the same metallic contact layer serving as a base electrode.

The insular layer need not be unitary but could be subdivided into a plurality of closely adjoining zones. Advantageously, that layer forms a closed or nearly closed loop around the emitter area, fully or partly overlain by the bridging contact layer, and has an inner boundary line which, along with parts of other such lines in the event of a more or less linear array of closely adjoining insular zones forming part of the ancillary layer, advantageously parallels the surface boundary or junction line between the base and emitter layers existing along that surface.

Since the ancillary layer contains the same type of impurities as the emitter layer, the two layers may be formed simultaneously by diffusion through a common mask according to a technique well known per se. In that case, of course, the ancillary layer will have the same depth as the emitter layer within the surrounding base layer. In principle, however, this ancillary layer could also be produced independently of the emitter layer and could therefore penetrate the base layer to a different depth, though such a procedure would be somewhat more costly.

BRIEF DESCRIPTION OF THE DRAWING

Representative embodiments of our invention have been illustrated, schematically and not to scale, in the accompanying drawing in which.

SPECIFIC DESCRIPTION

Figure 1:
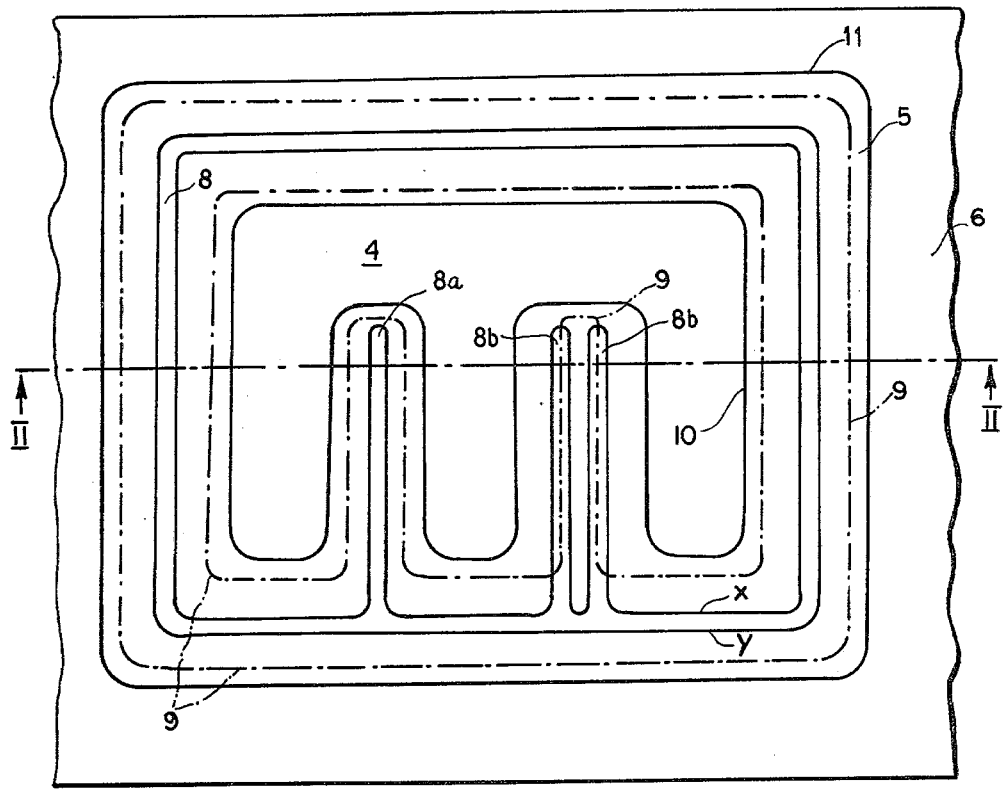
FIG. 1 is a plan view of part of a semiconductor body formed with a power transistor according to our invention.
Figure 2:
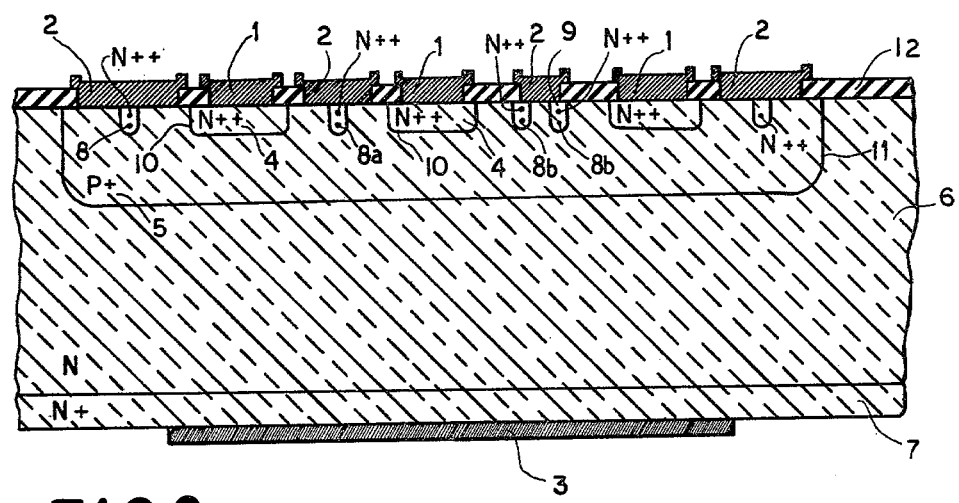
FIG. 2 is a cross-sectional view taken on the line II—II of FIG. 1.

In FIGS. 1 and 2 we have shown a silicon body 6 of N-type conductivity which constitutes the collector of a power transistor embodying our invention, the lower part of this body forming a more heavily doped layer 7 of N+ conductivity contacted by a metal electrode 3; layer 7 constitutes a substrate on which the remainder of body 6 is epitaxially grown. The opposite surface of body 6 is overlain by the usual passivating layer 12 which extends partly across a base layer 5 of P+ conductivity formed in the silicon body by the conventional diffusion process. A shallow emitter layer 4 of N++ conductivity is embedded in base layer 5 adjacent the upper body surface; layer 4, shown to be of ctenoid shape, has elongate zones interdigitated with similar zones of base layer 5 along the upper body surface. Passivating layer 12 has been omitted in FIG. 1 but its boundaries 9 have been indicated by dot-dash lines in that Figure. Windows formed in the passivating layer are occupied by metallic coatings 1 and 2, shown only in FIG. 2, respectively contacting the emitter layer 4 and the base layer 5.

In accordance with our present invention, an ancillary layer 8 of the same conductivity type (N++) as emitter layer 4 is formed in the base layer 5 and is contacted by the base electrode 2 while being otherwise insulated from emitter layer 4. As seen in FIG. 2, the two layers 4 and 8 extend to the same limited depth within the base layer 5, having been produced in one and the same diffusion operation. The insular ancillary layer 8 is bounded by two closed lines x and y which substantially parallel the lateral boundary 10 between emitter layer 4 and base layer 5. Layer 8 forms a single slender tongue 8a in the elongate zone of base layer 5 shown at left in FIG. 1; in the somewhat wider right-hand zone, two parallel tongues 8b are formed. Whereas tongue 8a is fully overlain by contact layer 2, the latter extends only partly over tongues 8b.

Figure 3:
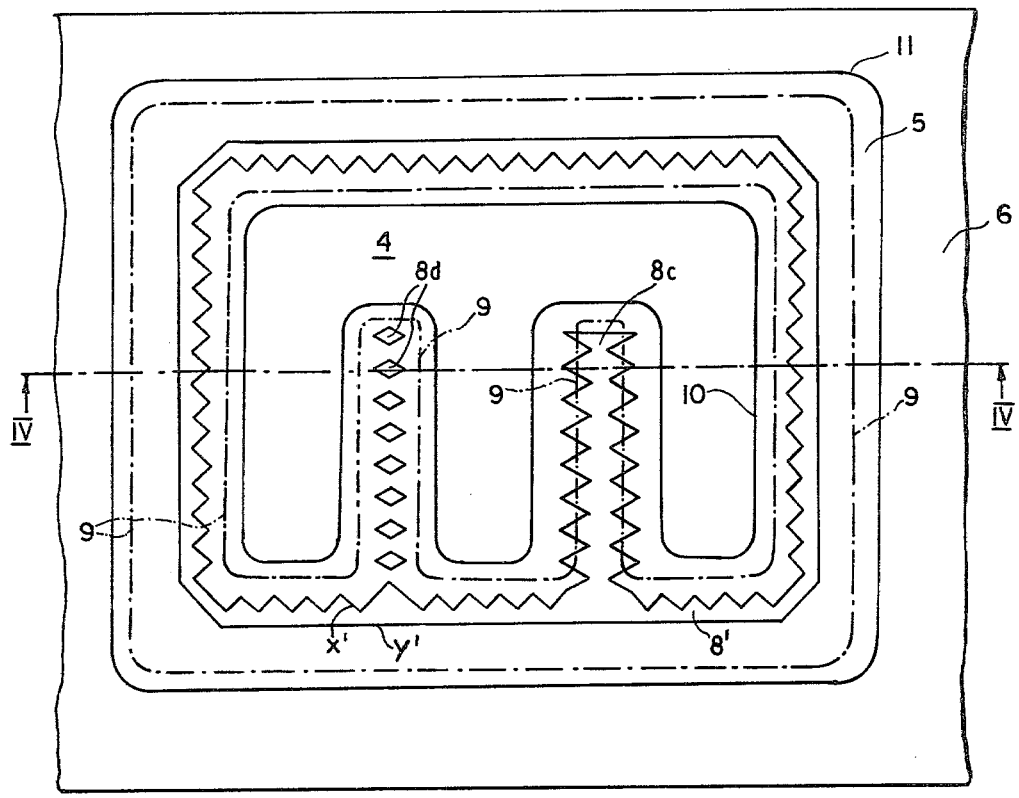
FIG. 3 is a view similar to FIG. 1, showing another embodiment.
Figure 4:
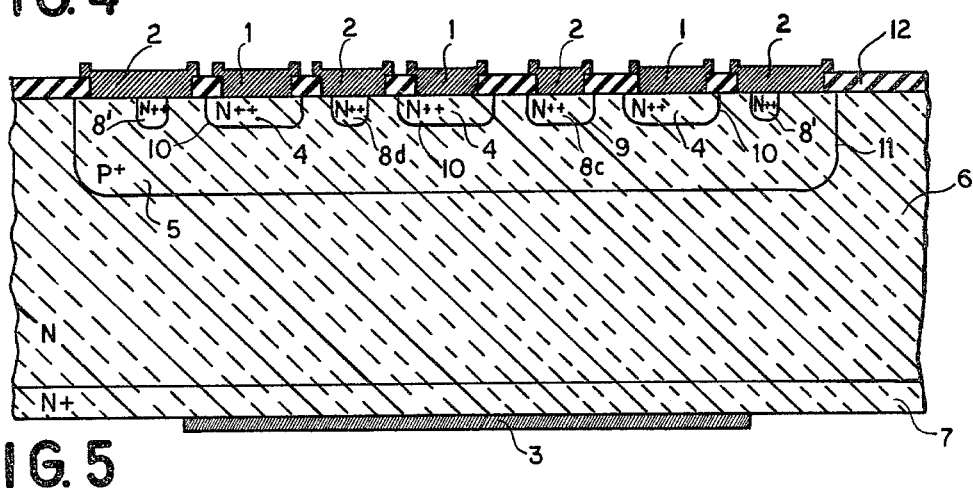
FIG. 4 is a cross-sectional view taken on the line IV—IV of FIG. 3.

In FIGS. 3 and 4 we have shown a transistor substantially identical with that of FIGS. 1 and 2 but with an ancillary layer divided into a coherent zone 8' forming a tongue 8c in the right-hand elongate zone of base layer 5, as well as a linear array of closely adjoining isolated zones 8d within the left-hand base zone. In this instance, too, boundaries x' and y' of layer 8' substantially parallel the lateral boundary 10 separating the emitter layer 4 from the base layer 5. The zones 8d of the ancillary layer are wholly overlain by the base electrode 2 which, however, covers only part of the tongue 8c. The inner boundary x' is of jagged shape and forms teeth projecting toward the surrounded emitter area.

Comparative tests were carried out on two groups of 50 NPN transistors each, formed on a common silicon wafer, one group being conventional while the other included an ancillary insular layer according to our invention laid out in a manner generally similar to the showing in the left-hand half of FIG. 1. The transistors were rated for an open-circuit input voltage of 1000 V and an output voltage of 550 V. The collectors were energized through 100-ohm resistors with a supply voltage of +250 V, giving rise to a collector current of 2.5 amps on saturation. The base current was +0.5 amp during conduction and −1.0 amp on turnoff.

Figure 5:
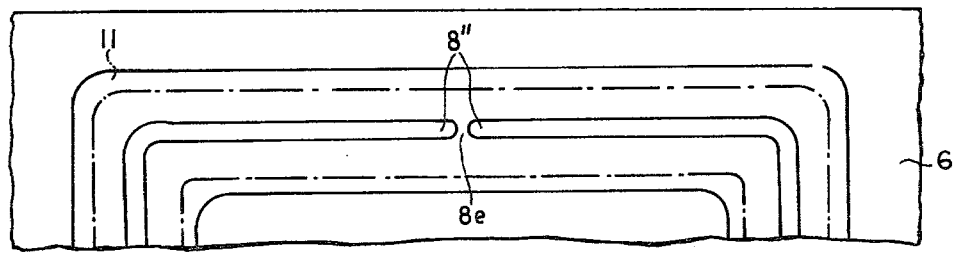
FIG. 5 is a fragmentary plan view illustrating a modification.

In FIG. 5 we have shown that a nearly closed loop, similar to that shown in FIG. 1, can be formed with an ancillary layer 8" having a small gap 8e, thus having only one closed boundary line instead of the two closed lines defining the layer 8. Obviously, layer 8' of FIG. 3 could be similarly modified.

The following average values were measured for the storage time $t_s$ and the fall time $t_f$:

|  | Control Group | Test Group |
| --- | --- | --- |
| $t_s$ | 1.5μsec | 1.1μsec |
| $t_f$ | 0.35μsec | 0.12μsec |

During the conductive state, when the base electrode 2 is biased positive with reference to emitter electrode 1, the negatively doped ancillary layer 8 (or 8', 8") is kept virtually free from minority carriers (electrons). This explains the accelerated sweep-pit. during turn-off, evidenced by the above-discussed tests.

Our invention is applicable to transistors of the illustrated "graded base" type as well as of the "uniform base" type.

We claim:

1. A junction transistor comprising a semiconductor body with a collector layer of one conductivity type, an adjoining base layer of the opposite conductivity type forming a surface of said body, an emitter layer of said one conductivity type embedded in said base layer along said surface and separated by said base layer from said collector layer, an insular ancillary layer of said one conductivity type embedded in said base layer along said surface in proximity to said emitter layer but separated by said base layer from said emitter and collector layers, and a set of electrodes in contact with said collector, base and emitter layers, respectively, said electrodes including a metallic contact layer on said surface bridging said base and ancillary layers.

2. A junction transistor as defined in claim 1 wherein said ancillary layer extends around said emitter layer along said surface and forms a substantially closed loop at least partly overlain by said contact layer.

3. A junction transistor as defined in claim 2 wherein said loop has at least one boundary substantially paralleling the junction line between said base and emitter layers along said surface.

4. A junction transistor as defined in claim 1, 2 or 3 wherein said ancillary layer forms an island in said base layer extending to the same depth as said emitter layer.

5. A junction transistor as defined in claim 1, 2 or 3 wherein said ancillary layer is subdivided into a plurality of closely adjoining zones.

* * * * *